Inventor:
James E. Genthe,
by John E. Toupal
Attorney

METHOD OF MAKING ELECTRICAL CAPACITORS

Filed Oct. 18, 1971 2 Sheets-Sheet 2

Inventor:
James E. Genthe,
by John E. Toupal
Attorney

United States Patent Office 3,732,100

Patented May 8, 1973

3,732,100

METHOD OF MAKING ELECTRICAL CAPACITORS

James E. Genthe, Chelmsford, Mass., assignor to Itek Corporation, Lexington, Mass.

Continuation-in-part of application Ser. No. 9,389, Feb. 6, 1970, which is a continuation-in-part of application Ser. No. 717,502, Apr. 1, 1968, both now abandoned. This application Oct. 18, 1971, Ser. No. 190,296

Claims priority, application Great Britain, Mar. 28, 1969, 16,264/69

Int. Cl. G03c *5/00, 11/00*

U.S. Cl. 96—38.4 6 Claims

ABSTRACT OF THE DISCLOSURE

An electrical component production method wherein an electrically conductive image electrode is exposed and photographically developed on the surface of a substrate supported photoconductive layer.

This application is a continuation-in-part application of U.S. Ser. No. 9,389, filed Feb. 6, 1970, now abandoned, which in turn is a continuation-in-part of U.S. Ser. No. 717,502, filed Apr. 1, 1968, now abandoned.

BACKGROUND OF THE INVENTION

This invention relates generally to electrical components and to a method for the production thereof. More specifically, the invention relates to a photographic process for producing electrical components and to the electrical products produced thereby.

Miniature and micro-electronic circuit technology utilizes various types of minute electrical components. Such components are produced generally by thin film deposition processes utilizing either mechanical application, stencil or electroplating techniques. These known film deposition processes exhibit various independent and collective undesirable characteristics including high cost, extensive processing time requirements, and extreme sensitivity to environmental conditions such as pressure, temperature, constituent makeup, etc.

The object of this invention, therefore, is to provide an improved method for producing electrical components particularly of the miniature and micro types.

CHARACTERIZATION OF THE INVENTION

The invention is characterized by the provision of a method for making electrical capacitors wherein a layer of photoconductive material is deposited on an electrically conductive substrate electrode, the latent image of a capacitor electrode is exposed upon the surface of the photoconductive material, and the capacitor electrode image is developed into an electrically conductive layer. According to this photographic method, microcapacitors can be produced by a process having reduced requirements for environmental condition control.

One feature of the invention is the provision of a method of the above type wherein the photoconductive material comprises titanium dioxide. Both the photographic and dielectric properties of titanium dioxide are particularly well suited for making capacitors according to the above described process.

The invention is characterized further by the provision of a method for making electrical components wherein a layer of photoconductive dielectric material is deposited on an electrically conductive substrate electrode, the latent image of an electrical circuit is exposed upon the surface of the photo-conductive material, and the electrical circuit image is developed into an electrically conductive layer adapted for connection to a source of electrical power. According to this photographic method, various types of miniaturized electrical components can be formed in a process having limited requirements for environmental condition control. Furthermore, because of the high resolution attainable in the photographic process, extremely precise circuit geometries can be produced.

Another features of this invention is the provision of a method of the above featured type wherein the latent electrical circuit image includes a plurality of capacitor electrodes. After development of the capacitor electrodes into conductive layers, they together with the conductive substrate and the photoconductive layer form a plurality of miniaturized capacitors.

The invention is characterized further by the provision of an electrical component including a base layer of photoconductive material, an electrical circuit including a plurality of electrodes which together with the substrate electrode and the photoconductive layer form a plurality of electrical capacitors. This component is suitable for use in miniature electronic circuits employing a plurality of commonly connected capacitors.

The invention is characterized further by the provision of a method for making electrical components wherein layers of photoconductive material are deposited on both surfaces of an insulator substrate, latent images of electrical circuits are exposed on both photoconductive layers, and the latent images are developed into electrically conductive electrode layers. The developed circuits and straddled photoconductive layers form electrical components with highly accurate electrical properties because of the precision with which both circuits can be formed photographically.

Another feature of the invention is the provision of an electrical device formed as described in the preceding paragraph and wherein each circuit comprises a plurality of electrodes aligned on opposite sides of the photoconductive layers. The aligned electrodes form a plurality of electrical capacitors.

DESCRIPTION OF DRAWINGS

Referring now to FIGS. 1–3, there is shown the insulator base 11 supporting the electrically conductive substrate 12. Deposited over the entire upper surface of the substrate 12 is the film layer 13 of photoconductive material. The photoconductive layer 13 supports and separates the photographically produced, electrically conductive image layer 14 from the conductive substrate electrode 12. Included in the image layer 14 is the image electrode 15 and the electrical terminal 16 suitable for connection to an electrical circuit (not shown). A similar electrical terminal 17 extends out of the substrate electrode 12.

Figures 1, 2, 3, 4, 5:
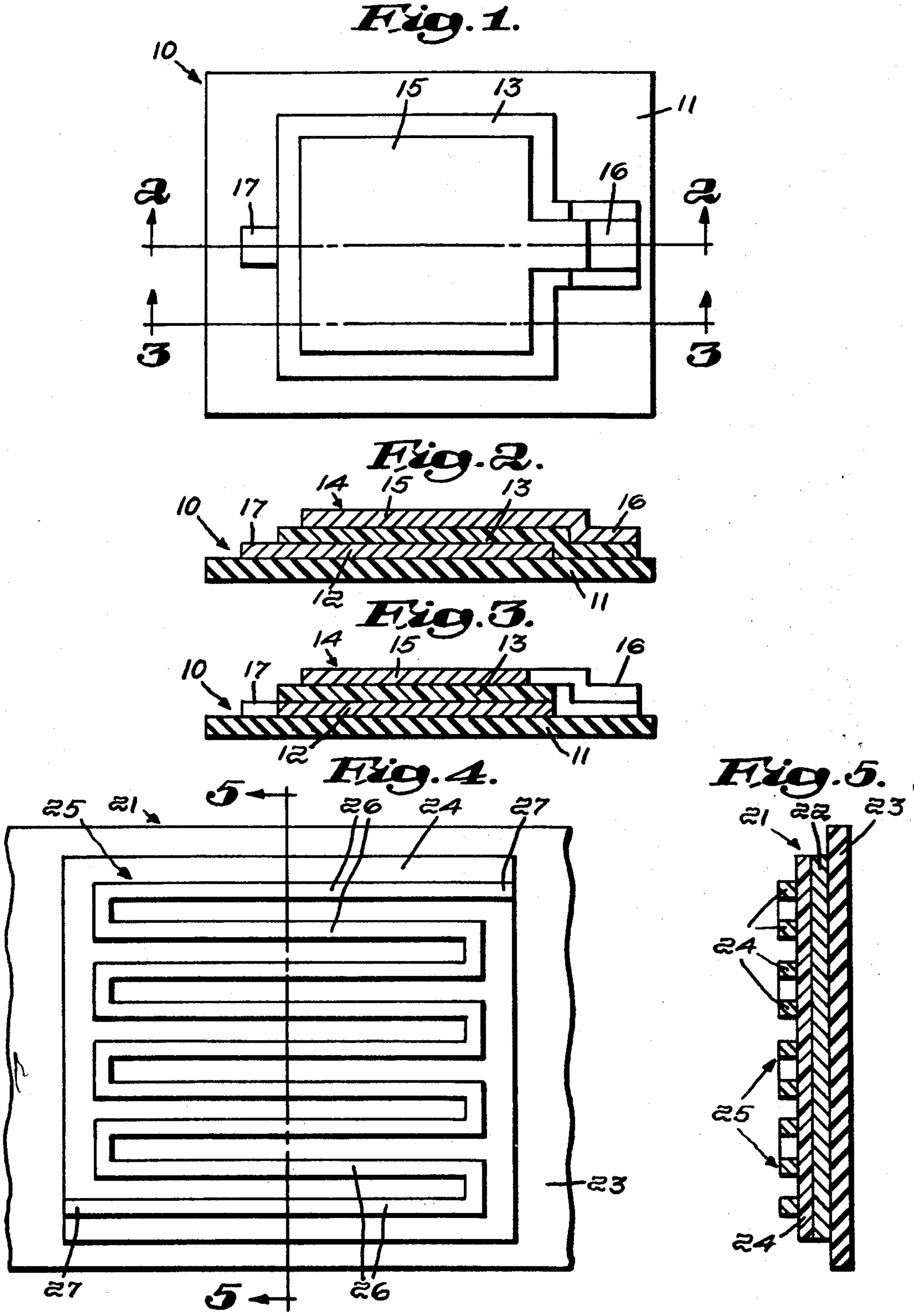
FIG. 1 is a schematic plan view illustrating one preferred embodiment of the invention.
FIG. 2 is a cross-sectional view of the embodiment shown in FIG. 1 taken along lines 2—2.
FIG. 3 is a cross-sectional view of the embodiment shown in FIG. 1 taken along lines 3—3.
FIG. 4 is a plan view illustrating another embodiment.
FIG. 5 is a cross-sectional view of the embodiment shown in FIG. 4 taken along lines 5—5.

In a preferred embodiment, the substrate electrode 12, formed of a suitable metal such as aluminum, nickel, titanium, copper, chromium, etc., is affixed by conventional methods to the base 11 comprising a suitable insulating material such as silicon dioxide or glass. Next, the photoconductive layer 13, preferably titanium dioxide, is deposited on the upper surface of the substrate electrode 12. For example, the titanium dioxide layer 13 can be formed as a reaction product on the surface of the substrate electrode 12 by reacting titanium tetrachloride with water vapor both of which have been previously mixed under controlled conditions of temperature and pressure with a gas carrier consisting of oxygen or nitrogen. A complete description of this process appears in U.S. Pat. 3,220,880 issued Nov. 30, 1965.

After deposition, the titanium dioxide layer 13 is exposed to patterned radiation conforming to the boundaries of the desired conductive layer 14. Since the photoconductive titanium dioxide is rendered chemically reactive by exposure to radiation, an activated latent image of the layer 14 is formed on its surface. This latent image is contacted with a developer system to effect a redox reaction between the developer system and the exposed surface. The redox reaction develops the conductive layer 14 by depositing free metal on the exposed surface defining the latent image. For example, the exposed surface of the titanium dioxide can be contacted with a solution containing ions of a metal such as copper, silver, mercury, gold, or other noble metal. The ions are reduced to free metal on contact with the activated chemically reactive portions of the photoconductive layer surface. Exposure to the metal ion solution can be maintained for a period sufficient to completely precipitate the conductive layer 14. However, shorter exposure times can also be used resulting in the deposition of free metal in amounts that are insufficient to form visible images. Such "latent developed images" can be subsequently amplified by contact with developer systems of a type known in the silver halide photographic arts. For example, a developer comprising silver ion in admixture with a reagent forming a redox system, such as hydroquinone, will deposit free silver on the latent image surface where free metal is already present, thereby forming the electrically conductive layer 14.

Although the above describes a preferred embodiment, it will be appreciated that the invention can be practiced in other ways. For example, the titanium dioxide layer 13 can be deposited in accordance with other well known processes such as by anodic oxidation of titanium metal in an electrolyte consisting of an aqueous solution of oxalic acid and ethyl alcohol: or by direct oxidation of titanium metal in oxygen at temperatures above 400° C. Similarly, the conductive layer 14 can be developed by other photographic processes such as by electrolytic dedevelopment wherein the latent image is subjected to electrolysis in the presence of an electrically reducible developer such as an aqueous solution of silver salts. In that case the substrate electrode 12 can provide the additional function of a cathode during the development process.

Referring now to FIGS. 4 and 5, there is shown the delay line device 21 including the electrically conductive substrate electrode 22 supported by the insulator base 23. Deposited on the top surface of the electrode 22 is the layer 24 composed of a suitable photoconductive material. The photographically developed, electrically conductive circuit image 25 is formed on the surface of the photoconductive layer 24. As shown in FIG. 4, the circuit image 25 includes the continuous, elongated and tortuous conductive path 26 terminating with the electrical terminals 27 adapted for connection in a suitable electrical circuit (not shown).

The individual portions of the delay line 21 are produced as described above in connection with the capacitor element 10. Naturally, the photographic development of the image electrode 25 requires exposure on the surface of the photoconductive layer 24 of a latent image conforming to the continuous path 26. The electrical characteristics on the device 21 produced are determined by both its physical properties and the geometry of the image electrode 25. A description of these factors appears in the book "Transmission Line Theory," King, page 46, published by McGraw-Hill in 1955. Because of the high resolution attainable with a photographic process, the geometry of conductive electrode 25 and therefore the characteristics of the device 21 can be quite carefully controlled.

Referring now to FIGS. 6–9 there is shown a circuit board 31 produced according to the present invention. The electrically conductive substrate electrode 32 is supported by the insulator base 33. Deposited on the top surface of the substrate electrode 33 is the layer 34 of a suitable photoconductive material such as titanium dioxide. Again, a photographically developed, electrically conductive circuit image 35 is formed on the surface of the photoconductive layer 34. The electrical terminal 36 is provided by a continuation of the circuit image 35. A similar electrical terminal 37 projects out of the conductive substrate electrode 32. The terminals 36 and 37 are adapted for connecting the circuit 35 in a suitable electrical system.

Figures 6, 7, 8, 9:
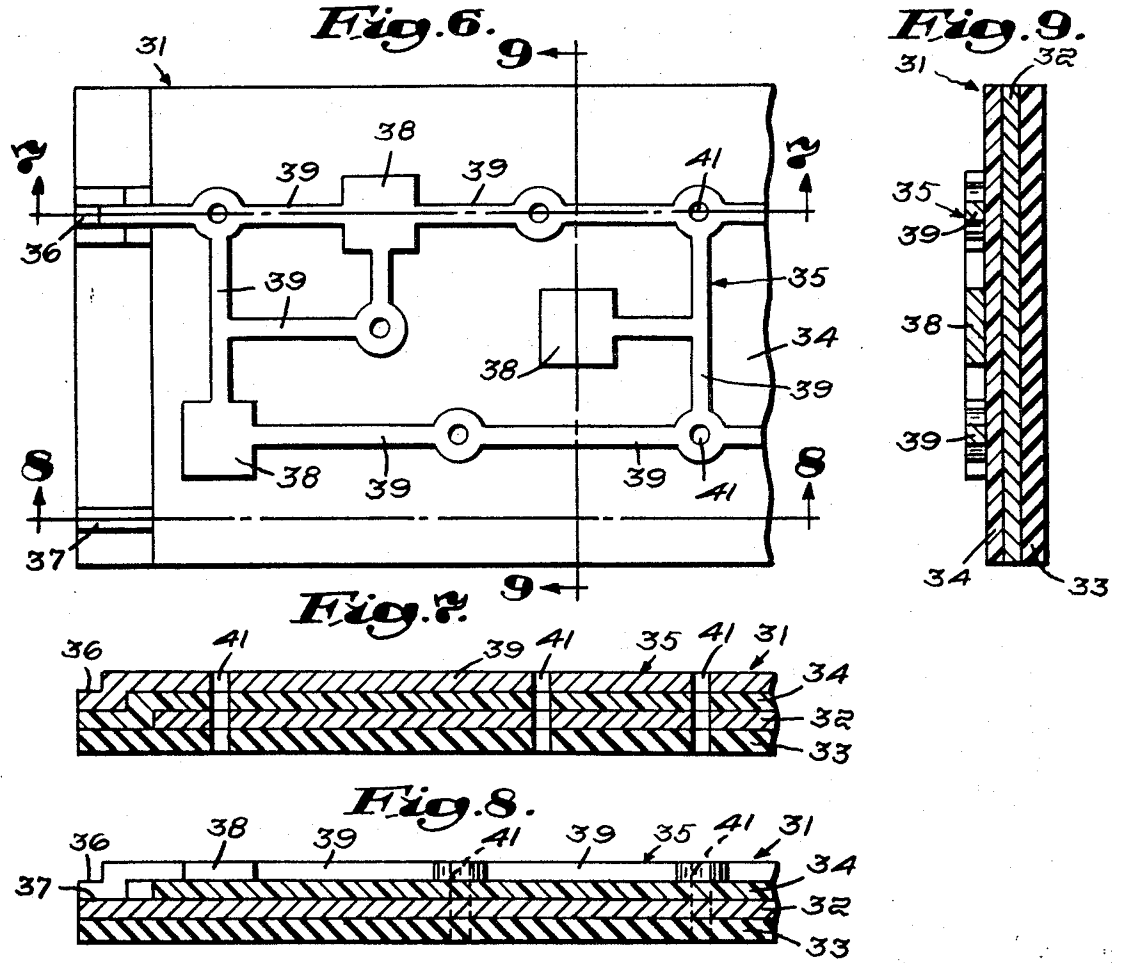
FIG. 6 is a plan view illustrating another embodiment.
FIG. 7 is a cross-sectional view of the embodiment shown in FIG. 6 taken along lines 7—7.
FIG. 8 is a cross-sectional view of the embodiment shown in FIG. 6 taken along lines 8—8.
FIG. 9 is a cross-sectional view of the embodiment shown in FIG. 6 taken along lines 9—9.

As shown in FIG. 6 the circuit image 35 comprises the capacitor electrodes 38 joined by the conductive circuit paths 39. Formed in the board 31 are the recepticle openings 41 adapted to receive, in conventional fashion, individual electrical components (not shown) suitable for connection in the conductive paths 39.

The circuit board 31 preferably is produced as described above with the circuit image 35 first formed as a latent image on the surface of the photoconductor layer 34 and then developed into an electrically conductive layer. The capacitor electrodes 38 together with the photoconductive layer 34 and substrate electrode 32 form a plurality of capacitors. Such an arrangement is particularly useful in the many circuit applications that utilize a plurality of commonly connected capacitors.

Figure 10:
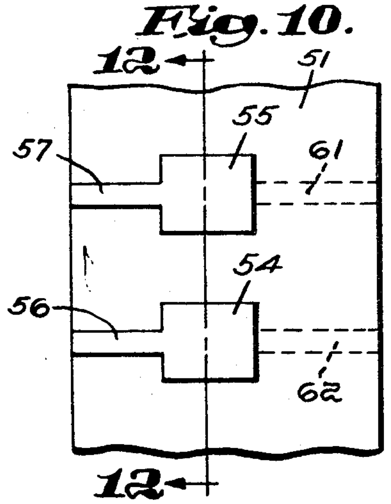
FIG. 10 is a plan view illustrating another embodiment.
Figure 11:
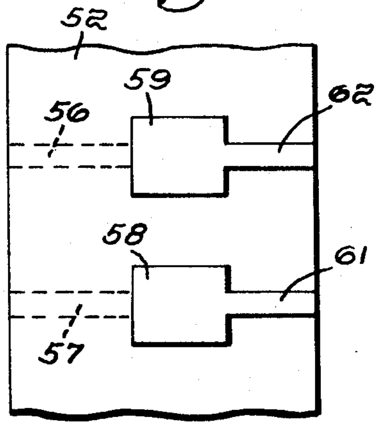
FIG. 11 is a bottom view of the embodiment shown in FIG. 10.
Figure 12:
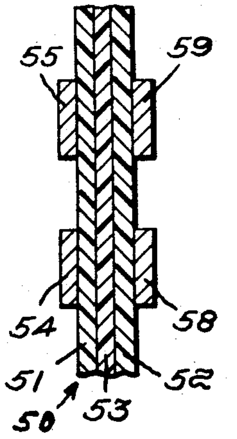
FIG. 12 is a cross-sectional view of the embodiment shown in FIGS. 10 and 11.

FIGS. 10–12 illustrate another embodiment of the invention wherein the base 50 comprises the photoconductive material layers 51 and 52 deposited on opposite surfaces of the substrate 53. Preferably, the substrate 53 is an extremely thin sheet of a flexible material such as the polymide film marketed under the trade name "Kapton" of the Du Pont Company. In the manner described above, a first photographically developed, electrically conductive image including the electrodes 54 and 55 and the associated terminals 56 and 57 is formed on the upper surface 51. A second photographically developed, electrically conducting image including the electrodes 58 and 59 and the associated terminals 61 and 62 is formed on the bottom surface 52. The electrode 54 is aligned with the electrode 58 so as to form therewith a first electrical capacitor having terminals 56 and 61. Similarly, the electrode 55 is aligned with the electrode 59 so as to form therewith a second electrical capacitor with terminals 57 and 62. Since both sets of electrodes are photographically developed, the electrical characteristics of the resultant capacitors can be carefully controlled.

The component image produced in accordance with the present invention is composed of continuous conductive metal as contrasted to granular or particulate metal which is normally associated with photographic images. The continuous metal image is, of course, more conductive and more suitable for electrical use. Methods for forming such continuous metal images are known to those skilled in the art. For example, the reducible metal ion in a viscous solution is first applied to the latent component image and then the reducing agent, in either liquid or viscous solution form is applied. The course of the reduction can be followed by observing the development of the latent image through the viscous layer. Alternatively, the latent image is developed in a solution containing both the sensitizing metal ion and the reducing agent. For best results, high purity reagents are employed and the solutions utilized are generally maintained free of contaminants, e.g. reuse of the same combined sensitizer and reducing agent solution is avoided, or at least minimized. If desired, the original metal component image so produced can be amplified with such metals as silver, tin or copper by so-called image amplification. This modification can be accomplished by merely immersing the metal component image in a solution of the amplifying metal ion containing a reducing agent for the amplifying metal. Alternatively, electroless metal plating baths can be used to provide the amplified metal image.

In a typical example of the invention, a photoconductive layer of titanium dioxide is coated on a suitable substrate. The surface of the photoconductive layer is then exposed to a source of ultraviolet radiation having a pattern that conforms to the desired component. Exposure to the ultraviolet radiation uniformly activates the exposed portions of the photoconductive layer creating a latent image of the circuit. Next, the surface of the photoconductive layer is contacted with the conductive metal image forming materials, e.g. the conductive metal ion solution such as silver nitrate and the reducing agent such as Metol (p-methylaminophenol sulfate). This development process produces precipitation of silver metal on the exposed portions of the photoconductive layer thereby forming the electrically conductive component image. More detailed descriptions of the systems suitable for forming the component image appear in British specification 1,043,250; U.S. Pats. Nos. 3,152,903 and 3,052,541; and French Pat. No. 345,206.

The preference for titanium dioxide as the photoconductor material results from its unexpectedly good photographic properties and, for capacitor use, a relatively high dielectric constant of about 100 and a relatively low dependence upon temperature and frequency. A capacitor produced with titanium dioxide exhibits a very desirable capacitance-to-volume ratio and a capacitance that is independent of the value of the voltage applied thereto. In this regard, it should be noted that by replacing the conductive electrode 12 in the embodiment of FIG. 1 with a substrate electrode formed of a semiconductor such as silicon or germanium, the capacitance of the device will vary as a function of the voltage applied thereto.

Other photoconductor or photocatalyst materials preferred in this invention include other metal containing photoconductors. A preferred group of such photosensitive materials are inorganic materials such as compounds of a metal and a non-metallic element of Group VI–A of the Periodic Table including oxides such as zinc oxide, titanium dioxide, zirconium dioxide, germanium dioxide, indium trioxide, tin oxide, barium titanate; metal sulfides such as cadmum sulfide, zinc sulfide, and tin disulfide; and metal selenides such as cadmium selenide. Metal oxides are especially preferred photoconductors of this group. Titanium dioxide is a preferred metal oxide because of its relatively low electrical conductivity. Titanium dioxide having an average particle size less than about 250 millimicrons and which has been treated in an oxidizing atmosphere at a temperature between about 200° C. and 950° C. for from about 0.5 hour to about 30 hours is especially preferred, and more especially, that titanium dioxide produced by high temperature pyrolysis of titanium halide.

While the exact mechanism by which the photoconductors of this invention are sensitized is not known, it is believed that exposure of the photoconductor or photocatalyst to activating means causes an electron or electrons to be transferred from the valance band of the photoconductor or photocatalyst to the conductance band of the same or at least to some similar excited state whereby the electron is loosely held, thereby changing the photoconductor from an inactive form to an active form. If the active form of the photoconductor is in the presence of an electron accepting compound, a transfer of electrons will take place between the photoconductor and the electron accepting compound, thereby reducing the electron accepting compound. Therefore a simple test which may be used to determine whether or not materials have a photoconductor or photocatalytic effect is to mix the material in question with an aqueous solution of silver nitrate. Little, if any, reaction should take place in the absence of light. The mixture is then subjected to light. At the same time a control sample of an aqueous solution of silver nitrate alone is subjected to light, such as ultraviolet light. If the mixture darkens faster than the silver nitrate alone, that material is a photoconductor.

Other materials which are useful for forming the component images in this invention are those such as described in U.S. Pat. 3,152,903 and in British specification 1,043,250. These image-forming materials include preferably an oxidizing agent and a reducing agent. Such image-forming materials are often referred to in the art as physical developers. The oxidizing agent is generally the image-forming component of the image-forming material. Preferred oxidizing agents comprise the reducible ions of electrically conductive metals having at least the oxidizing power of cupric ion. These include such metal ions as $Ag^{+}$, $Hg^{+2}$, $Pb^{+4}$, $Au^{+3}$, $Pt^{+4}$, $Ni^{+2}$, $Sn^{+2}$, $Pb^{+2}$, $Cu^{+1}$, and $Cu^{+2}$.

The reducing agent components of the component image-forming materials of this invention include organic compounds such as the oxalates, formates, substituted and unsubstituted hydroxylamine, and substituted and unsubstituted hydrozine, ascorbic acid, aminophenols, and the dihydric phenols. Also, polyvinylpyrrolidone, alkali and alkaline earth metal oxalates and formates are useful as reducing agents. Suitable reducing compounds include hydroquinone or derivatives thereof, o- and p-aminophenol, p-methylaminophenol sulfate, p-hydroxyphenyl glycine, o- and p-phenylene diamine, and 1-phenyl-3-pyrazolidone.

Additional component image-forming materials useful in this invention are disclosed in U.S. Pat. No. 3,106,156 wherein a metal is deposited electrolytically on activated portions of the photoconductor. Furthermore, the image-forming materials or physical developers may contain organic acids which can react with metal ions to form complex metal anions. Also, the developers may contain other complexing agents and the like to improve image formation and other properties found to be desirable in this art.

Additional stabilizing and fixing steps such as known to the art may also be added to the processes of this invention in order to increase the life and permanence of the component image produced.

Other irradiation sources which are useful in this invention for producing the latent image of the desired component include any activating electromagnetic radiation. Thus actinic light, X-rays, or gamma rays are effective in exciting the photoconductor. Beams of electrons and other like particles may also be used in the place of the ordinary forms of electromagnetic radiation for forming the component image according to this invention.

Furthermore, the photoconductor layer may be sensitized to visible and other wavelengths of light by foreign ion doping, addition of fluorescent materials, and/or by means of sensitizing dyes. Bleachable dyes useful for sensitizing the photoconductors of this invention include, for example, the cyanine dyes, the dicarbocyanine dyes, the carbocyanine dyes, and the hemicyanine dyes. In certain applications, the ability to use visible light can simplify the component image exposure step.

For capacitor production, the substrate electrode 12, formed of a suitable metal such as aluminum, nickel, titanium, copper, chromium, etc., is affixed by conventional methods to the base 11 comprising a suitable insulating material such as silicon dioxide or glass. Next, the photoconductive layer 13, preferably titanium dioxide, is deposited on the upper surface of the substrate electrode 12. For example, the titanium dioxide layer 13 can be formed as a reaction product on the surface of the substrate electrode 12 by reacting titanium tetrachloride with water vapor both of which have been previously mixed under controlled conditions of temperature and pressure with a gas carrier consisting of oxygen or nitrogen. A complete description of this process appears in U.S. Pat. 3,220,880, issued Nov. 30, 1965.

EXAMPLE 1

A layer of titanium dioxide in binder composed of a methacrylate polymer (in a ratio of four parts of photoconductor to one part of polymer) is coated on both sides of a polyester film subbed on both sides and the medium is exposed on each side to form a reversible latent image of an electric circuit on each side using a source of ultraviolet light as the exposure light. Exposure time is 30 seconds on each side.

The exposed medium is then coated with a viscous layer (3-mil thickness) of 3 M silver nitrate solution and the medium is then immersed in a saturated solution of Metol containing 60 g./l. of citric acid monohydrate for 30 seconds.

A uniform, continuous silver metal image of the original electrical circuit forms on each side during the immersion. The medium is then washed with warm water, fixed with aqueous sodium thiosulfate solution, water-washed and finally dried. The termini of the circuits on each side are connected to a voltage source and conductivity tests are successful. The film can thus be used as an electrical capacitor.

EXAMPLE 2

Using the same exposure and development procedure of Example 1, a capacitor is produced with a medium formed by coating titanium dioxide on an electrically conducting substrate according to the procedure of U.S. Pat. 3,220,880.

Obviously, many modifications and variations of the present invention are possible in light of the above teachings. For example only, electrical devices other than those illustrated can be produced according to the photographic method described. It is to be understood, therefore, that within the scope of the appended claims the invention can be practiced otherwise than as specifically described.

What is claimed is:

1. A method of making electrical capacitors consisting essentially of the steps of (1) depositing a layer of photoconductive material on a substrate electrode, such photoconductive material having suitable dielectric properties for use as a capacitor and which upon exposure to activating radiation and contact with a developer solution of metal ions causes the reduction of metal ions to the metallic state; (2) exposing the latent image of a capacitor electrode on said layer of photoconductive material; and (3) developing said image into an electrically conductive layer by contacting with a developer comprising a solution of metal ions.

2. A method according to claim 1 wherein said photoconductive material comprises titanium dioxide.

3. A method according to claim 2 wherein said substrate electrode is formed of electrically conductive material.

4. A method according to claim 2 wherein said substrate electrode is formed of electrically semiconductive material.

5. A method according to claim 1 wherein the developer additionally comprises a reducing agent for said metal ions.

6. A method as in claim 5 wherein said metal ions comprise silver ions.

References Cited

UNITED STATES PATENTS 3,674,485 7/1972 Jonker et al. -------- 96—38.4

DAVID KLEIN, Primary Examiner

U.S. Cl. X.R.

96—1 R, 48 PD; 317—242